United States Patent
Ohmi et al.

(10) Patent No.: US 9,157,681 B2
(45) Date of Patent: Oct. 13, 2015

(54) SURFACE TREATMENT METHOD FOR ATOMICALLY FLATTENING A SILICON WAFER AND HEAT TREATMENT APPARATUS

(75) Inventors: Tadahiro Ohmi, Miyagi (JP); Akinobu Teramoto, Miyagi (JP); Tomoyuki Suwa, Miyagi (JP)

(73) Assignee: National University Corporation Tohoku University, Miyagi (JP)

( * ) Notice: Subject to any disclaimer, the term of this patent is extended or adjusted under 35 U.S.C. 154(b) by 0 days.

(21) Appl. No.: 13/565,868

(22) Filed: Aug. 3, 2012

(65) Prior Publication Data

US 2012/0292743 A1    Nov. 22, 2012

Related U.S. Application Data

(63) Continuation-in-part of application No. PCT/JP2011/052107, filed on Feb. 2, 2011, and a continuation-in-part of application No. PCT/JP2012/059374, filed on Apr. 5, 2012.

(30) Foreign Application Priority Data

Feb. 4, 2010   (JP) .................................. 2010-023101

(51) Int. Cl.
| | |
|---|---|
| *H01L 29/06* | (2006.01) |
| *F27B 17/00* | (2006.01) |
| *H01L 21/02* | (2006.01) |
| *H01L 21/302* | (2006.01) |

(Continued)

(52) U.S. Cl.
CPC ...... *F27B 17/0025* (2013.01); *H01L 21/02052* (2013.01); *H01L 21/02238* (2013.01); *H01L 21/02252* (2013.01); *H01L 21/302* (2013.01); *H01L 21/3247* (2013.01); *H01L 21/67017* (2013.01); *H01L 21/67109* (2013.01); *H01L 21/67126* (2013.01); *H01L 21/67757* (2013.01)

(58) Field of Classification Search
CPC ..... H01L 21/477; H01L 21/324; H01L 21/42; H01L 21/26
USPC ..................... 257/40, 98, 628, 190
See application file for complete search history.

(56) References Cited

U.S. PATENT DOCUMENTS

| | | | |
|---|---|---|---|
| 2002/0045146 A1* | 4/2002 | Wang et al. ..................... | 432/49 |
| 2003/0170583 A1 | 9/2003 | Nakashima et al. | |

(Continued)

FOREIGN PATENT DOCUMENTS

| | | |
|---|---|---|
| EP | 2 315 237 A1 | 4/2011 |
| JP | 8-213335 A | 8/1996 |

(Continued)

OTHER PUBLICATIONS

Ohmi et al., Dependence of Electron Channel Mobility on Si—SiO2 Interface Microroughness, IEEE Electron Device Letters, vol. 12, No. 12, pp. 652-654, Dec. 1991.

(Continued)

*Primary Examiner* — Robert Bachner
*Assistant Examiner* — Moin Rahman
(74) *Attorney, Agent, or Firm* — Morgan, Lewis & Bockius LLP

(57) ABSTRACT

In a silicon wafer which has a surface with a plurality of terraces formed stepwise by single-atomic-layer steps, respectively, no slip line is formed.

5 Claims, 16 Drawing Sheets

(51) Int. Cl.
*H01L 21/67* (2006.01)
*H01L 21/677* (2006.01)
*H01L 21/324* (2006.01)

(56) References Cited

U.S. PATENT DOCUMENTS

| | | | |
|---|---|---|---|
| 2004/0035530 A1* | 2/2004 | Iizuka | 156/345.29 |
| 2004/0045580 A1* | 3/2004 | Kurita et al. | 134/3 |
| 2006/0017101 A1 | 1/2006 | Ohmi et al. | |
| 2006/0024908 A1 | 2/2006 | Neyret et al. | |
| 2006/0131553 A1* | 6/2006 | Yamanaka et al. | 257/1 |
| 2007/0059904 A1* | 3/2007 | Izumome | 438/487 |
| 2007/0117406 A1 | 5/2007 | Saito | |
| 2007/0169688 A1* | 7/2007 | Yoon et al. | 117/94 |
| 2009/0170345 A1* | 7/2009 | Akae et al. | 438/786 |

FOREIGN PATENT DOCUMENTS

| | | |
|---|---|---|
| JP | 2002-255700 A | 9/2002 |
| JP | 2003-324106 A | 11/2003 |
| JP | 2004-265918 A | 9/2004 |
| JP | 2005-142445 A | 6/2005 |
| JP | 2006-032732 A | 2/2006 |
| JP | 2006-080294 A | 3/2006 |
| JP | 2007-516586 A | 6/2007 |
| JP | 2007-173788 A | 7/2007 |
| WO | 2010/018654 A1 | 2/2010 |
| WO | 2011/096417 A1 | 8/2011 |

OTHER PUBLICATIONS

Zhong et al., Evidence of spontaneous formation of steps on silicon (100), Physical Review B, vol. 54, No. 4, pp. R2304-R2307, Jul. 1996.
Ohmi, Total Room Temperature Wet Cleaning for Si Substrate Surface, J. Electrochem. Soc., vol. 143, No. 9, pp. 2957-2964, Sep. 1996.
International Search Report dated Jun. 19, 2012 for International Application No. PCT/JP2012/059374.
International Search Report dated Mar. 8, 2011 for International Application No. PCT/JP2011/052107.
Office Action mailed on Aug. 27, 2014 in corresponding Japanese Patent Application No. 2011-552791, including an English-language translation of Relevant Part thereof.

* cited by examiner (Comparative Example 1)
Heat Treatment Temperature: 1100°C
Ar Flow Rate: 10L/min
Heat Treatment Time: 60min
(a)

(Example 4)
Heat Treatment Temperature: 900°C
Ar Flow Rate: 10L/min
Heat Treatment Time: 60min
(b)

(Example 1)
Heat Treatment Temperature: 850°C
Ar Flow Rate: 20L/min
Heat Treatment Time: 180min
(c)

(Example 2)
Heat Treatment Temperature: 850°C
Ar Flow Rate: 10L/min
Heat Treatment Time: 540min
(d)

(Example 1)
Heat Treatment Temperature: 850°C
Ar Flow Rate: 20L/min
Heat Treatment Time: 180min (a)

(Example 4-1)
Heat Treatment Temperature: 900°C
Ar Flow Rate: 10L/min
Heat Treatment Time: 60min (b)

(Comparative Example 1)
Heat Treatment Temperature: 1100°C
Ar Flow Rate: 10L/min
Heat Treatment Time: 60min (c)

(Comparative Example 2)
Heat Treatment Temperature: 1200°C
Ar Flow Rate: 10L/min
Heat Treatment Time: 60min (d)

| After Oxidation (After Treatment) | Before Oxidation (Before Treatment) | |
|---|---|---|
| | | Example 5 (Radical Oxidation) |
| | | Comparative Example 3 (Thermal Oxidation at 900°C) |
| | | Comparative Example 4 (Thermal Oxidation at 1000°C) |
| | | Comparative Example 5 (No Oxidation) |

FIG. 11

(Example 4-2)
Heat Treatment Temperature: 800°C
Ar Flow Rate: 14L/min
Heat Treatment Time: 90min

SURFACE TREATMENT METHOD FOR ATOMICALLY FLATTENING A SILICON WAFER AND HEAT TREATMENT APPARATUS

This application is a continuation-in-part of International Application No. PCT/JP2011/052107, filed on Feb. 2, 2011, and International Application No. PCT/JP2012/059374, filed on Apr. 5, 2012, the disclosures of which are incorporated herein in their entirety by reference.

This application is based upon and claims the benefit of priority from Japanese Patent Application No. 2010-023101, filed on Feb. 4, 2010, the disclosure of which is incorporated herein in its entirety by reference.

TECHNICAL FIELD

This invention relates to a method of flattening a surface of a silicon wafer for forming a semiconductor device such as an IC or LSI.

BACKGROUND ART

The asperity of a surface of a silicon wafer for forming a semiconductor device such as an IC or LSI is a factor which prevents an improvement of current drivability of a MOSFET (Metal Oxide Semiconductor Field Effect Transistor), as shown in, for example, Non-Patent Document 1 and, therefore, the surface is required to be as flat as possible.

On the other hand, it is reported that when a silicon wafer is heat-treated in an Ar atmosphere at 1200° C., it is possible to form an extremely flat surface on which the atomic-level step-and-terrace morphology appears (see Non-Patent Document 2).

However, the high-temperature treatment at 1200° C. makes mass production difficult.

Meanwhile, Patent Document 1 describes that a 200 mm$\phi$ wafer surface can be atomically flattened without any slip line by performing a heat treatment in a high-purity Ar gas atmosphere at 850° C.

PRIOR ART DOCUMENTS

Patent Document

Patent Document 1: WO2011/096417A1

Non-Patent Documents

Non-Patent Document 1: T. Ohmi, K. Kotani, A. Teramoto, and M. Miyashita, IEEE Elec. Dev. Lett., 12, 652 (1991).
Non-Patent Document 2: L. Zhong, A. Hojo, Y. Matsushita, Y. Aiba, K. Hayashi, R. Takeda, H. Shirai, and H. Saito, Phy. Rev. B. 54, 2304 (1996).

SUMMARY OF THE INVENTION

Although Patent Document 1 definitely describes that, according to its method, when a silicon wafer having a large diameter such as 200 mm$\phi$ is heat-treated in a high-purity Ar gas atmosphere at a low temperature of 850° C., a crystal defect called a slip line is not formed. However, no description is made at all in Patent Document 1 about whether the method is suitable for mass production, whether the method is applicable to a larger-diameter silicon wafer, whether, even if the method is applicable thereto, the yield is high enough to be suitable for mass production, or the like.

That is, Patent Document 1 does not disclose whether or not it is possible to prevent the formation of a crystal defect even if a large number of large-diameter silicon wafers are continuously and successively treated for mass production.

This invention aims to pursue a problem in mass production of atomically flattened large-diameter silicon wafers with no slip line, thereby realizing the mass production.

Specifically, it is an object of this invention to provide a silicon wafer atomically flattening surface treatment method which can carry out a slip-lineless atomically flattening treatment with a good yield even if the diameter is set to as large as 200 mm$\phi$ or more, and which can obtain, with a high yield, silicon wafers having an atomic-order surface flatness equivalent to that of an initial wafer even if a heat treatment apparatus is used repeatedly.

It is another object of this invention to provide a silicon wafer atomically flattening surface treatment method which can carry out, with a high yield, an atomically flattening surface treatment of larger-diameter wafers at a lower temperature, with a smaller amount of use of gas, and more speedily by using a higher-purity heat treatment atmospheric gas.

Means for Solving the Problem

According to a first aspect of this invention, there is provided a silicon wafer atomically flattening surface treatment method, wherein a silicon wafer is placed within a heat treatment space of a heat treatment apparatus and a gas transport passage for introducing a heat treatment atmospheric gas from the outside into the heat treatment space of the heat treatment apparatus has a double space structure separated at a joint portion with the heat treatment apparatus, wherein the double space structure has an inner space communicating with the heat treatment space and an outer space which does not communicate with the heat treatment space and which is adapted to evacuate a transported gas to the outside, and wherein, in a silicon wafer heat treatment process, the heat treatment atmospheric gas is caused to flow in the inner space while the heat treatment atmospheric gas or a gas equivalent to the heat treatment atmospheric gas is caused to flow in the outer space.

According to a second aspect of this invention, there is provided a silicon wafer atomically flattening surface treatment method by a surface heat treatment, wherein a heat treatment is carried out at a heat treatment temperature of 900° C. or less while introducing a heat treatment atmospheric gas with a purity of 0.2 vol.ppb or less moisture content and 0.1 vol.ppb or less oxygen content into a heat treatment space, where a silicon wafer is placed, in a heat treatment apparatus.

According to a third aspect of this invention, there is provided, in the second aspect, a silicon wafer atomically flattening surface treatment method comprising carrying out a heat treatment at a heat treatment temperature of 900° C. or less while introducing a heat treatment atmospheric gas with a purity of 0.02 vol.ppb or less moisture content and 0.01 vol.ppb or less oxygen content.

Effect of the Invention

According to this invention, it is possible to provide a silicon wafer having an atomic-order surface flatness and having no slip line even if the wafer has a large area of 200 mm$\phi$ or more.

In addition, according to this invention, it is possible to carry out, with a high yield, an atomically flattening surface treatment of larger-diameter wafers at a lower temperature, with a smaller amount of use of gas, and more speedily by successively using a higher-purity heat treatment atmospheric gas.

BRIEF DESCRIPTION OF THE DRAWINGS

FIG. 11 is a photographic diagram showing AFM images of sample surfaces before and after oxidation (before and after treatment) in Example 5 and Comparative Examples 3 to 5.

MODE FOR CARRYING OUT THE INVENTION

Hereinbelow, a preferred embodiment of this invention will be described in detail with reference to the drawings. First, a silicon wafer according to this embodiment will be briefly described.

A silicon wafer subjected to atomically flattening surface treatment according to a surface treatment method of this invention has a surface formed with a plurality of terraces which are formed stepwise by single-atomic-layer steps, respectively, wherein no slip line exists.

Figure 1:
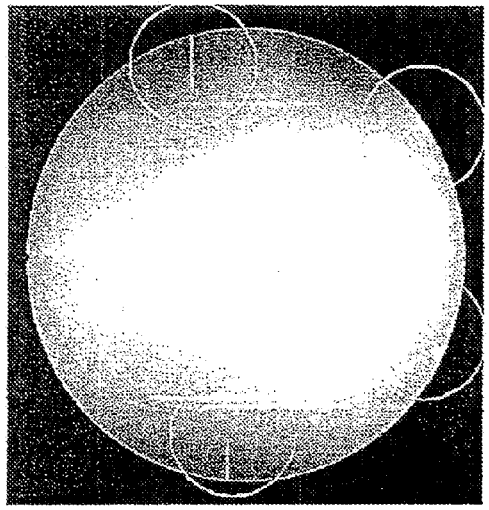
FIG. 1 is diagrams showing X-ray topography results (four samples) when silicon wafers were heat-treated under various conditions.
Figure 1:
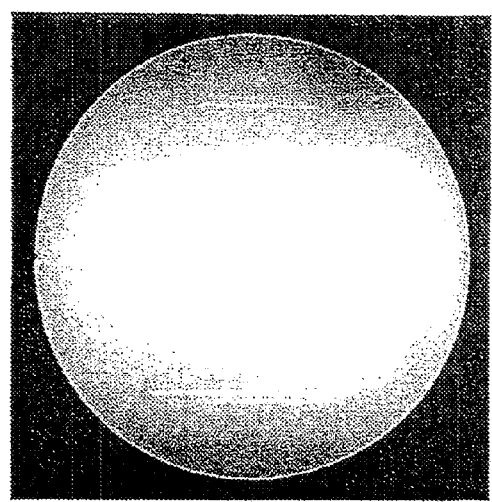
Figure 1:
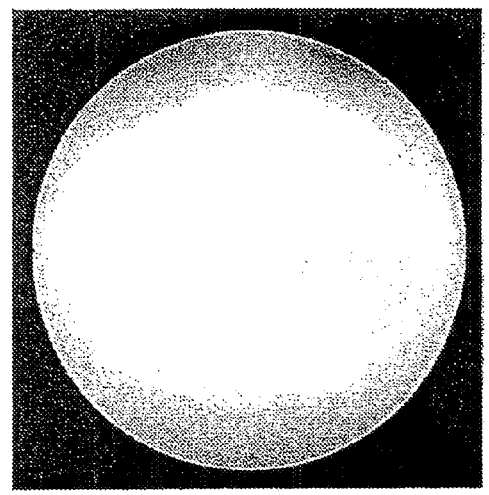
Figure 1:
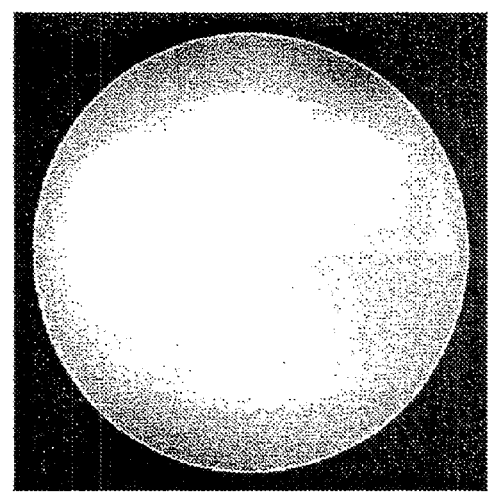

Herein, "slip line" represents a sort of "crystal defect" that occurs due to the dislocation of regularly arranged silicon atoms at a high temperature when a silicon wafer is heat-treated, and has a crack-like shape, for example, as shown at portions respectively surrounded by white circles in FIG. 1 (a). That is, the silicon wafer obtained by the surface treatment method of this invention has a structure which is free of crystal defects.

Figure 2:
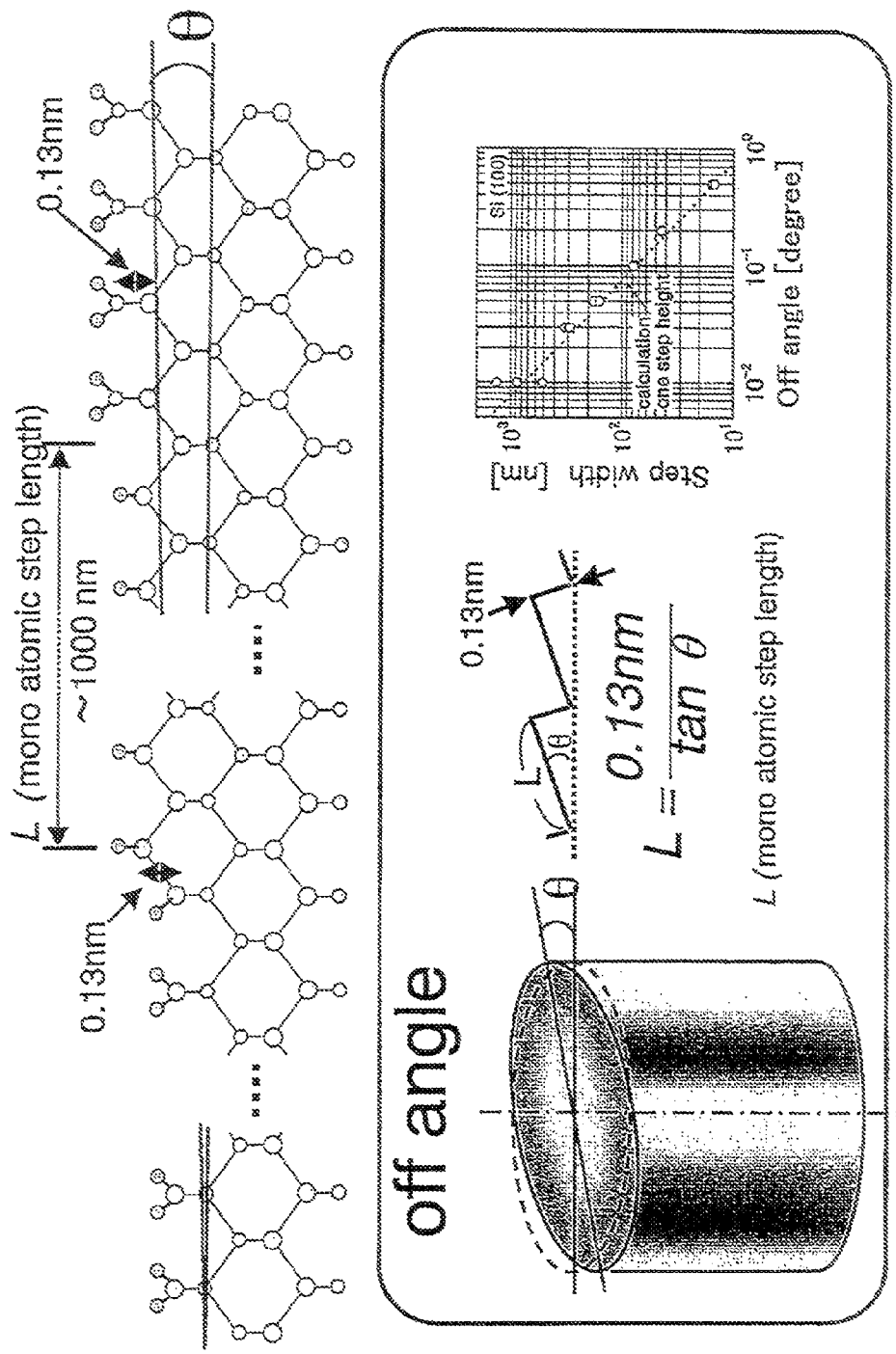
FIG. 2 is an exemplary explanatory diagram showing a relationship between the off angle and the terrace width of a silicon wafer according to an embodiment of this invention.

On the other hand, the state in which the surface has the plurality of terraces formed stepwise by the atomic-order steps, respectively, represents a state shown in FIG. 2.

As exemplarily shown in FIG. 2, the surface of the silicon wafer according to this embodiment is inclined by an off angle (θ) from a Just (100) plane.

FIG. 2 shows a state in which a crystal at a substrate surface has a (100) plane and a plane orientation is inclined by 0.06 degrees as an off angle with respect to the (100) plane in a direction inclined by 36 degrees toward a <011> direction with respect to a <01-1> direction.

At the atomic level, when the substrate surface is inclined by the off angle (θ), lattice points on the surface are different as shown in FIG. 2. Steps $S_A$ and $S_B$ appear at positions where the lattice points on the surface change. The height of each step is 0.13 nm which corresponds to a mono atomic step on the silicon (100) surface.

The number of steps and terraces at this time is, as shown in FIG. 2, given by a formula (1).

$$L = 0.13/\tan \theta (\text{nm}) \quad (1)$$

L: terrace width, θ: off angle from the (100) plane

The terrace widths have variation of several atoms at the atomic level. However, the variation is as small as on the order of nm and falls within a range so that the influence on characteristics is negligible or, if any, very small. Accordingly, the terrace widths can be said to be substantially the same. Further, the directions of the steps are not aligned in a straight line and differ by several atoms at the atomic level. However, the difference is also as small as on the order of nm and falls within a range so that the influence on characteristics is negligible or, if any, very small. Accordingly, the directions of the steps can be regarded to be substantially linear and aligned in one direction so that the steps can be said to be formed substantially in the same direction. The present inventors have confirmed that the relationship between the terrace width L obtained from an AFM image and the off angle obtained by X-ray diffraction measurement well agrees with the result of the formula (1).

That is, the steps formed on the silicon surface are each in the form of a single atomic layer. Further, likewise, the off angles can also be recognized to be substantially the same angle as an average angle. In the following description, it will simply be indicated that the step directions are the same, the terrace widths are the same, and the off angles are the same.

In order to obtain the silicon wafer having the surface formed with the plurality of terraces which are formed stepwise by the single-atomic-layer steps, respectively, and having no slip line as described above, an atomically flattening surface treatment may be carried out in the following manner. A silicon wafer is placed within a a heat treatment space of a heat treatment apparatus and a gas transport passage for introducing a heat treatment atmospheric gas from the outside into the heat treatment space of the heat treatment apparatus has a double space structure separated at a joint portion with the heat treatment apparatus, wherein the double space structure has an inner space communicating with the heat treatment space and an outer space not communicating with the heat treatment space and adapted to discharge a transported gas to the outside. In a silicon wafer heat treatment process, the heat treatment atmospheric gas is caused to flow in the inner space while the heat treatment atmospheric gas or a gas equivalent to the heat treatment atmospheric gas is caused to flow in the outer space.

Figure 3:
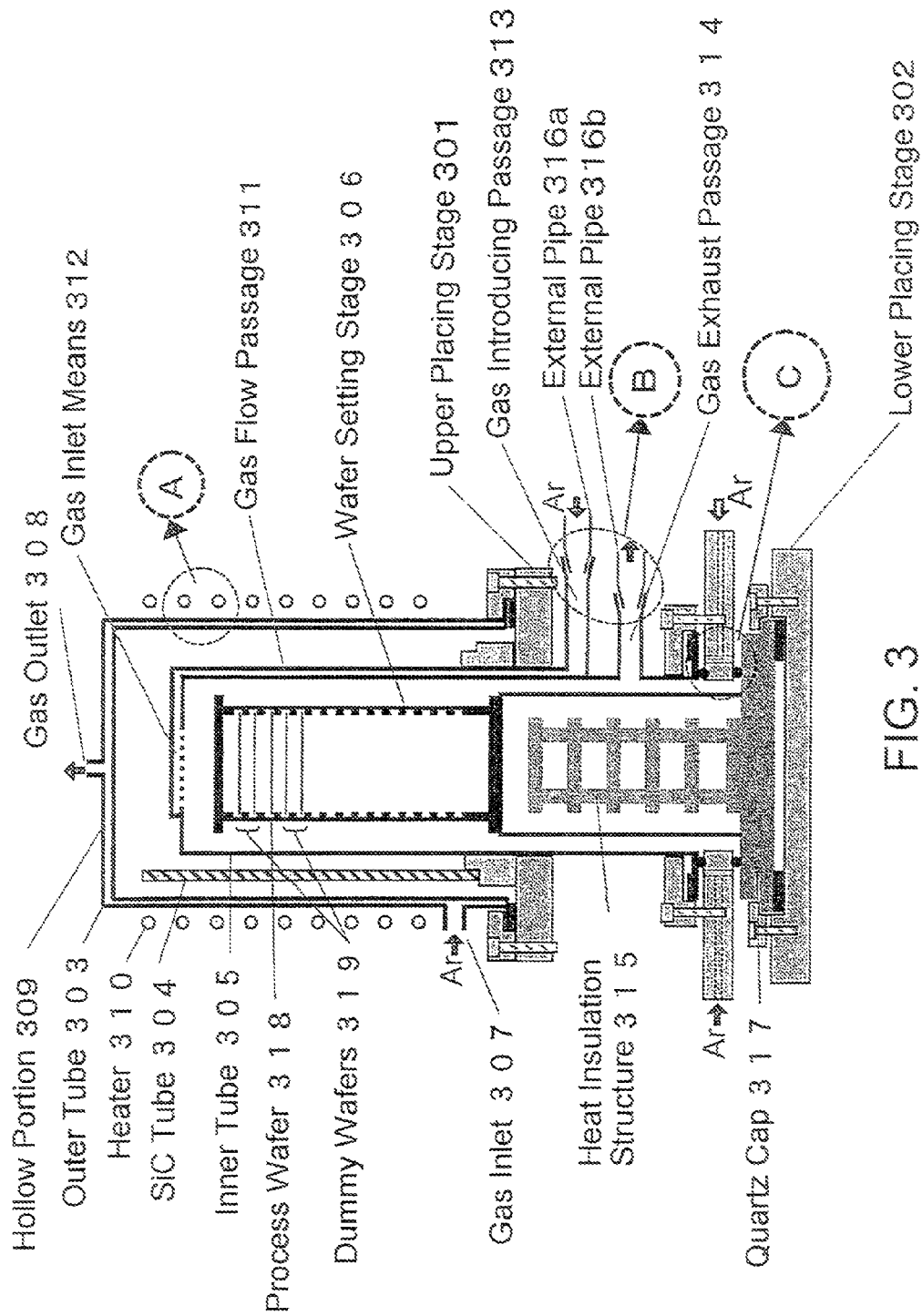
FIG. 3 is an exemplary explanatory diagram for explaining a typical specific example as one of preferred heat treatment apparatuses adapted for use in Examples of this invention.

FIG. 3 is an exemplary explanatory diagram showing one example of a heat treatment apparatus which is preferably used for embodying this invention. A heat treatment apparatus 300 shown in FIG. 3 has an upper placing stage 301 and a lower placing stage 302 in a two-layer structure.

An outer tube 303 is placed on the upper placing stage 301. In the outer tube 303, a SiC (silicon carbide) tube 304, an inner tube 305, and a wafer setting stage 306 are disposed in this order from the outer side in the figure.

The outer tube 303 is made of a highly heat-resistant glass material such as quartz and has a tubular structure with a hollow double structure. The outer tube 303 has a gas inlet 307 and a gas outlet 308 as illustrated and is configured such that a gas flows in a hollow portion 309 of the double structure from the gas inlet 307 toward the gas outlet 308. Heaters 310 provided at a desired pitch are attached to the outside of the outer tube 303.

When a heat treatment is carried out for a long time or repeatedly, if the outer tube 303 is made of quartz for the purpose of facilitating internal observation from the outside, a metal due to the heaters 310 passes through the outer tube 303 and, although a little, enters the heat treatment apparatus. In order to prevent this, an inert gas such as an Ar gas is caused to flow in the hollow portion 309 of the outer tube 303, thereby preventing the metal from entering a heat treatment space.

Figure 4:
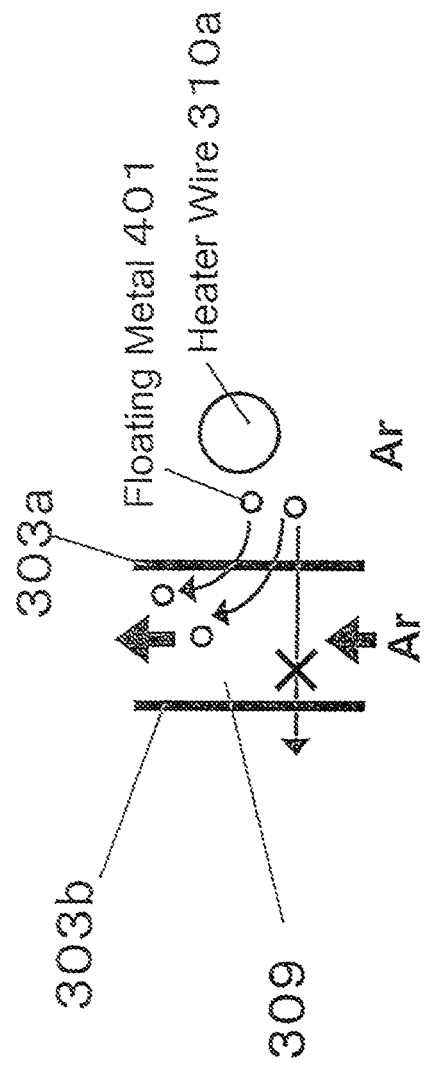
FIG. 4 is an exemplary explanatory diagram for explaining, on an enlarged scale, a portion A shown in FIG. 3.

Details of this will be described using FIG. 4. When a heater wire 310a disposed on the outside of the outer tube 303 continues to generate heat for maintaining the heat treatment temperature in the heat treatment apparatus, a metal is separated from the heater wire 310a so as to be a floating metal 401 which then passes through an outer wall 303a of the outer tube 303 to enter the inside of the apparatus.

In this event, if the flow of an inert gas such as an Ar gas is formed in advance in the hollow portion 309 of the outer tube 303, the separated metal is discharged along with the Ar gas to the outside of the apparatus through the gas outlet 308 by the gas flow and thus is prevented from passing through an inner wall 303b of the outer tube 303 to enter further inside the apparatus.

During a heat treatment, a space between the outer tube 303 and the inner tube 305 is maintained at a desired degree of vacuum according to need so that the inside of the inner tube 305 can be kept clean.

A gas flow passage 311 is provided on the outside of the inner tube 305 for introducing a heat treatment atmospheric gas into the inner tube 305 from the outside. The gas flow passage 311 communicates with a gas inlet means 312 provided at an upper portion of the inner tube 305 and has, on the upstream side, a gas introducing passage 313 for introducing the heat treatment atmospheric gas from the outside.

In the gas inlet means 312, small holes are provided according to a desired specification and design for introducing the introducing gas into the inner tube 305. The inner tube 305 extends downward to near the lower placing stage 302 and communicates, at an intermediate position between the upper placing stage 301 and the lower placing stage 302, with a gas exhaust passage 314 which is for discharging the heat treatment atmospheric gas from the inner tube 305.

The wafer setting stage 306 has a structure in which a predetermined number of grooves for setting wafers are provided on the inside so that any number of wafers, from one to many at a time, can be heat-treated.

When setting wafers in the wafer setting stage 306, a predetermined number of dummy wafers 319 are arranged at upper and lower positions of a wafer (process wafer 318) to be heat-treated as shown in FIG. 3, thereby uniformly heating and maintaining the entire surface of the process wafer 318. Consequently, the entire heat-treated surface of the process wafer 318 is maintained at a uniform temperature.

In order to make heat distribution uniform in a space where the wafer setting stage 306 is disposed, a heat insulation structure 315 is disposed in the lower part of the wafer setting stage 306. The heat insulation structure 315 is preferably, for example, a ladder structure made of quartz or the like. In particular, if it is made of quartz foam, the shape can be arbitrary and the apparent heat capacity can be increased, which is thus preferable.

As illustrated, external pipes 316a and 316b are connected to the gas introducing passage 313 and the gas exhaust passage 314, respectively.

In this invention, the following contrivances are applied to connecting positions of the external pipes (portion B indicated by an arrow with a dotted circle) and to a portion sealed by an O-ring or the like (portion C indicated by an arrow with a dotted circle).

Figure 5:
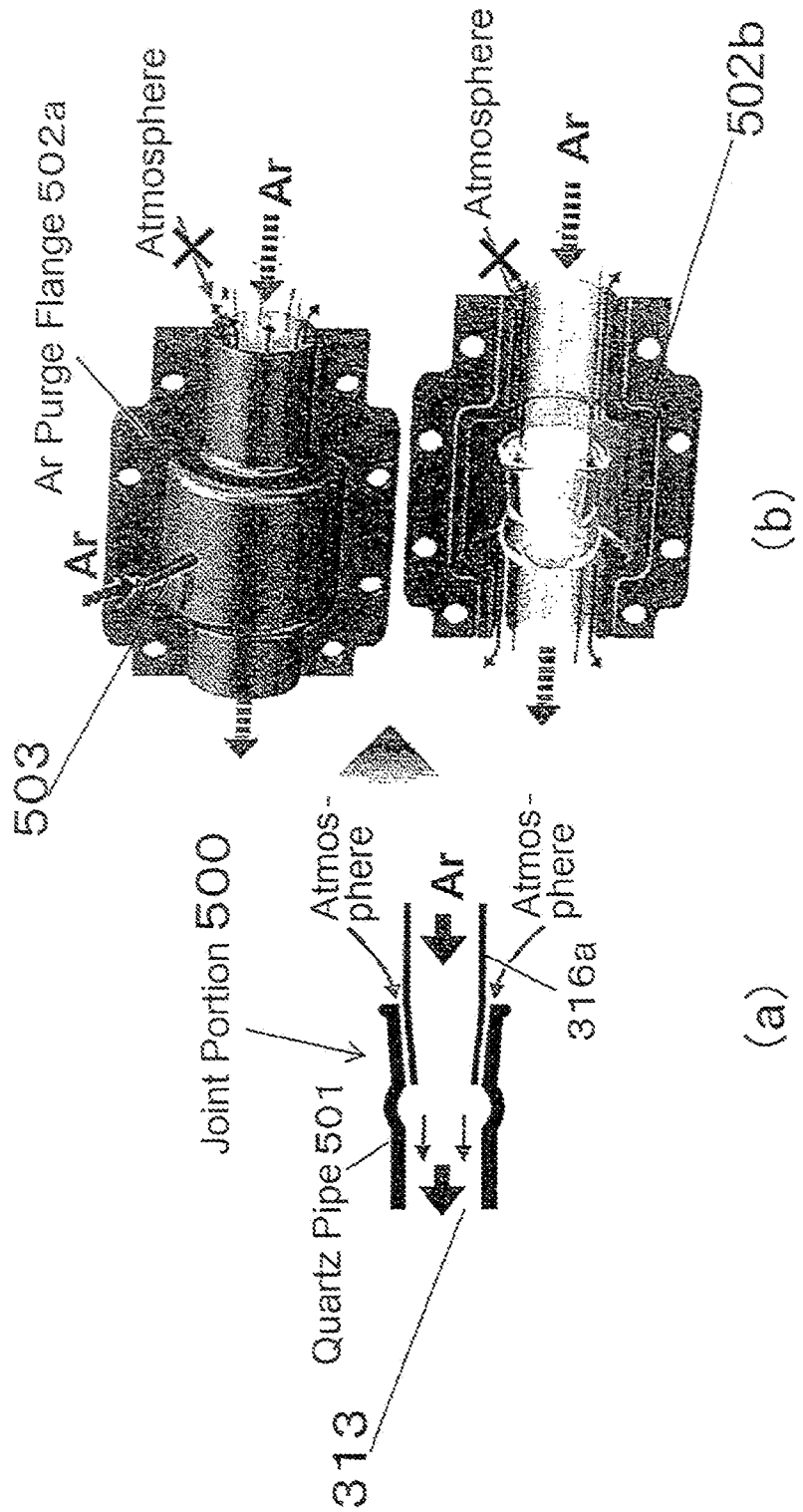
FIG. 5 shows (a) an exemplary explanatory diagram for explaining, on an enlarged scale, a portion B shown in FIG. 3, wherein a structure used in a related art is shown, and (b) an exemplary explanatory diagram for explaining, on an enlarged scale, a portion B shown in FIG. 3, wherein a structure adapted for use in this invention is shown.

First, a description will be given with reference to FIG. 5 showing the portion B on an enlarged scale. In FIG. 5, (a) is for explaining a method according to a related art while (b) is for explaining a method according to this invention.

The present inventors have clarified that if a pipe has a joint portion strictly sealed, even when strictly sealing is carried out, invasion of the atmosphere is not avoidable through the joint portion 500, although an amount is very little and, as a result, a heat treatment atmosphere is varied with an increase of repetition times for a long-time use. Even if a heat treatment atmospheric gas which is as pure as possible is used, the atmospheric components gradually enter through the joint portion with the lapse of time so as to back-diffuse into the heat treatment space, thereby contaminating the heat treatment atmosphere. Although the amount of the atmospheric components that cause contamination is very small, if it is the water component or the oxygen component, it seriously affects a heat treatment even though its amount is extremely small, so that intended large-area silicon wafers having an atomic-order flatness and having no slip line cannot be manufactured with high productivity. That is, it is not possible to mass-produce slip-lineless large-area silicon wafers.

A quartz pipe 501 forming the gas introducing passage 313 and the external pipe 316a are connected together to allow the heat treatment atmospheric gas to be introduced into the heat treatment space of the heat treatment apparatus from the outside.

According to the results of studies by the present inventors, when the heat treatment apparatus is used for a long time or repeatedly, even if an attempt is made to provide a more secure connection at the connecting position (joint portion 500) to thereby prevent entering of the atmosphere, temporal changes occur to allow the atmosphere to gradually enter through the joint portion 500.

In order to prevent this, in this invention, as shown in FIG. 5(b), a structural contrivance is made such that the joint portion 500 is surrounded by a pair of purge flanges 502a and 502b and a purge gas is caused to flow at a desired relative positive pressure in a space between the joint portion 500 and a flange 502, thereby completely preventing entering of the atmosphere through the joint portion 500. The purge gas is introduced from a pipe 503.

As the purge gas, use is made of a gas of the same kind as the heat treatment atmospheric gas or a gas equivalent thereto. In particular, it is preferable to use the gas of the same kind as the heat treatment atmospheric gas.

While, in FIG. 5 (b), the description has been given with respect to the gas introducing passage 313 for the heat treatment atmospheric gas, the same structure is provided with respect to the gas exhaust passage 314.

Figure 6:
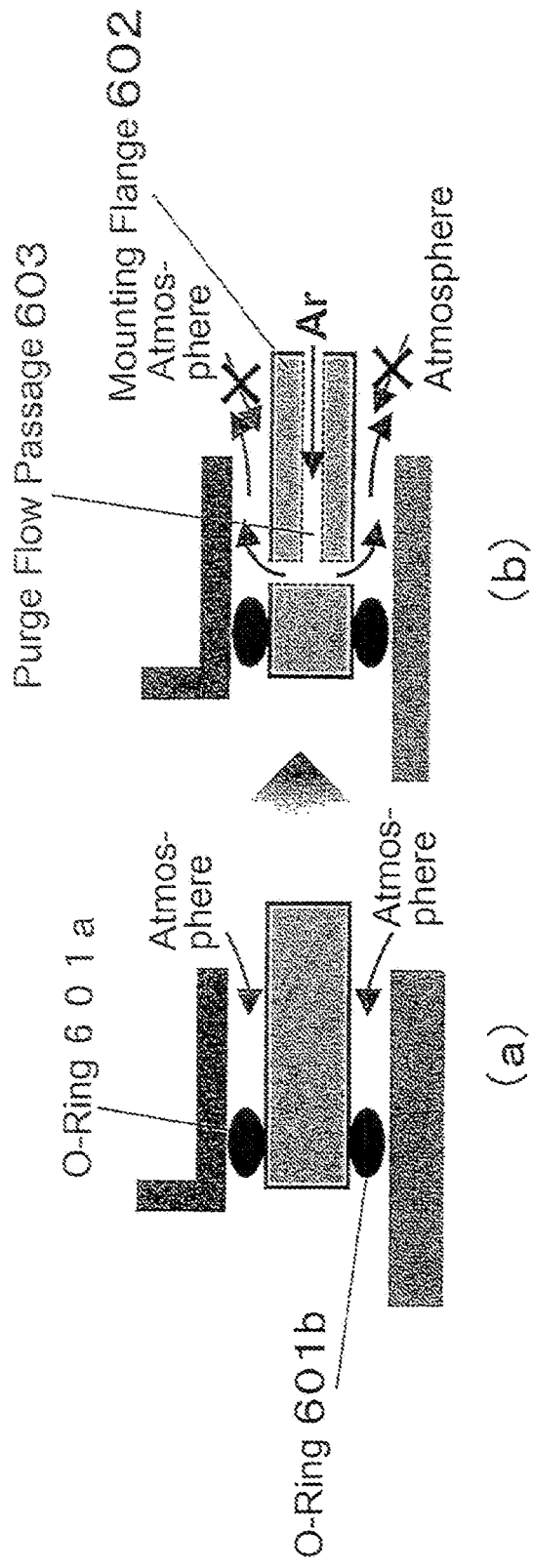
FIG. 6 shows (a) an exemplary explanatory diagram for explaining, on an enlarged scale, a portion C shown in FIG. 3, wherein a structure used in a related art is shown, and (b) an exemplary explanatory diagram for explaining, on an enlarged scale, a portion C shown in FIG. 3, wherein a structure adapted for use in this invention is shown.

Next, referring to FIG. 6, a description will be given of a structural contrivance, in this invention, of a portion sealed by an O-ring or the like (portion C indicated by an arrow with a dotted circle). In FIG. 6, (a) shows a structure according to a related art while (b) shows a structure according to this invention.

As has also been described with reference to FIG. 5, however elaborately sealing is carried out with an O-ring or the like to maintain the airtightness, temporal changes over a long time, particularly temporal changes when heat is applied, reduce the airtightness, so that the atmosphere gradually enters through a small gap between the apparatus and the O-ring. In order to prevent this, as shown in FIG. 6 (b), a purge flow passage 603 is provided in a mounting flange 602 to allow a purge gas to flow therein at a desired relative positive pressure, thereby completely preventing entering of the atmosphere into the apparatus.

According to studies by the present inventors, a conclusion has been obtained that if a heat treatment is carried out at a fairly high temperature such as about 1200° C. in a heat treatment apparatus of a conventional structure using as a heat treatment atmospheric gas a commercial high-purity argon (Ar) gas which can be obtained relatively easily, it is possible to form a slip-lineless silicon wafer, but that, in the case of a large-area wafer of about 200 mmφ, it is substantially difficult to obtain a slip-lineless atomic-order flatness over the entire wafer surface in consideration of the productivity.

The purity of the commercial high-purity argon (Ar) gas which can be obtained relatively easily is higher than 99.9999 vol % which corresponds to Grade 1 (G1) class in the gas quality standard, the oxygen ($O_2$) content thereof is less than 0.1 vol.ppm, and the moisture ($H_2O$) content thereof is less than −80° C. by dew point.

In the above-mentioned application of the present inventors (Patent Document 1), it is described that, using an argon (Ar) gas which is further increased in purity and has a moisture content of 0.2 vol.ppb or less and an oxygen content of 0.1 vol.ppb or less, a large-area silicon wafer of about 200 mmφ having a slip-lineless atomic-order flatness over the entire wafer surface can be obtained by carrying out a heat treatment in a temperature range of 800 to 900° C. which is far lower than conventional.

The above-mentioned first and third aspects of this invention have been further developed from this technique and are each an atomically flattening surface treatment method which can carry out a slip-lineless atomically flattening treatment with a high yield and with high productivity even for large-diameter silicon wafers of 200 mmφ or more and which is thus most suitable for mass production.

Further, according to the above-mentioned third aspect of this invention, using a higher-purity heat treatment atmospheric gas, it is possible to carry out, with a high yield, an atomically flattening surface treatment of larger-diameter wafers at a lower temperature, with a smaller amount of use of gas, and more speedily.

It is preferable that the inner tube 305 which is used in this event be purified as much as possible.

In this invention, a gas species which is inert (non-responsive) to the silicon wafer surface is used as the heat treatment atmospheric gas. As such a gas, it is preferable to use a noble gas such as Ar (argon) or He (helium), an inert gas such as $N_2$ (nitrogen), or a mixed gas in which two or more kinds of these gases are mixed. In particular, in this invention, it is preferable to use Ar (argon).

The temperature in the heat treatment is preferably set to 900° C. or less. By setting the heat treatment temperature to 900° C. or less, a wafer with no slip line is obtained even in the case of a large-diameter silicon wafer of 300 mmφ or more.

However, since the atomically flat surface cannot be obtained by a heat treatment at an excessively low temperature, the temperature in the heat treatment is preferably set to 700° C. or more, more preferably 750° C. or more, further preferably 800° C. or more. Thus, the temperature during the heat treatment preferably falls within a range between 700° C. and 900° C.

When forming MOSFETs, the above-mentioned silicon wafer which has the surface formed with the plurality of terraces formed stepwise by the single-atomic-layer steps, respectively, and which has no slip line makes it possible to form the MOSFETs with a good yield without degrading the current drivability of the MOSFETs.

Herein, a method of forming a MOSFET using the silicon wafer according to this embodiment will be described with reference to FIGS. 8 and 9.

First, a surface of a semiconductor substrate 901 (silicon wafer, silicon substrate) having been subjected to the above-mentioned treatment (heat treatment at 900° C. or less) is cleaned by a cleaning method using no alkaline solution.

Figure 9:
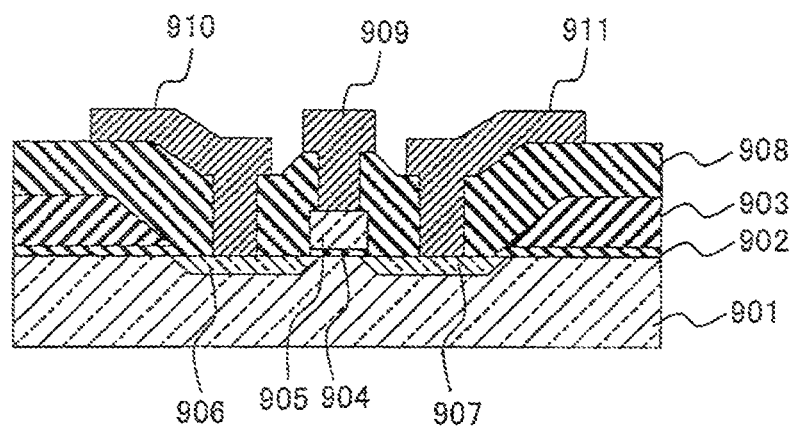
FIG. 9 is an exemplary cross-sectional view in a source-drain direction of FIG. 8.

Then, as shown in FIG. 9, a $SiO_2$ film 902 is formed by radical oxidation which directly oxidizes the substrate surface by oxygen radicals generated by, for example, plasma, and then a $SiO_2$ film 903 is formed by CVD or the like.

Then, an active region where a MOS transistor is to be formed is opened by photolithography or the like. In this event, as shown in FIG. 8, it is preferable to set a carrier traveling direction to a direction parallel to steps so that the steps do not exist in a source-drain direction (the steps do not cross the carrier traveling direction). With this configuration, it is possible to realize a MOSFET in which the roughness is extremely small and the carrier mobility is high in the carrier traveling direction.

Figure 8:
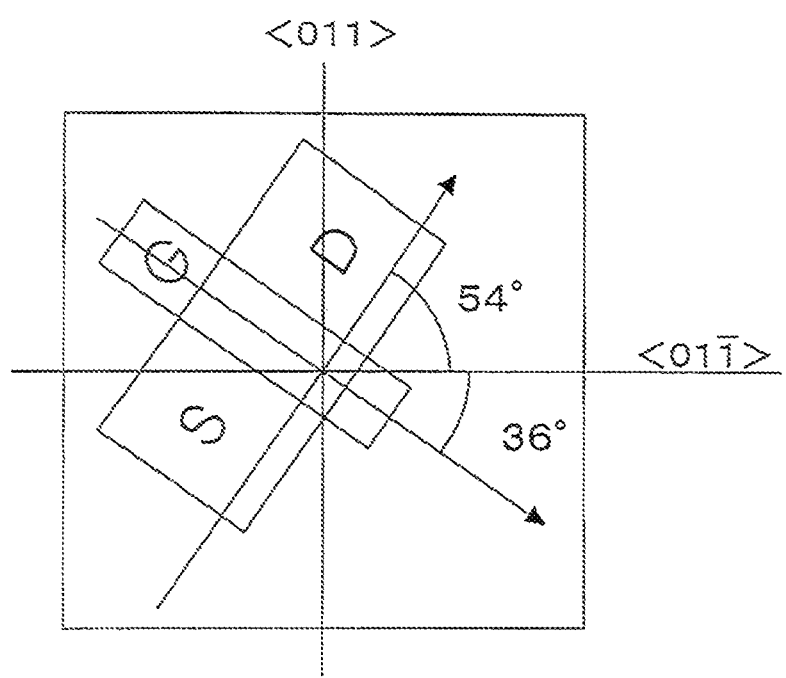
FIG. 8 is an exemplary plan view showing one example when a MOSFET is formed on a silicon wafer according to this embodiment.

FIG. 8 exemplifies a case where the source-drain is set in a direction inclined by 54 degrees toward a <011> direction with respect to a <01-1> direction.

Then, as shown in FIG. 9, the $SiO_2$ film 902 and the $SiO_2$ film 903 at an opening portion are removed using a photoresist as a mask material and then the photoresist is removed. Although the opening is formed at each of a plurality (large number) of portions where transistors are to be formed, respectively, FIGS. 8 and 9 show one of the opening portions and one of the transistors. Thereafter, the exposed semiconductor surface is cleaned by the cleaning method using no alkaline solution. Then, a $SiO_2$ film 904 is formed as a gate insulating film by radical oxidation and polycrystalline polysilicon is formed as a gate electrode 905. In the case of isotropic oxidation such as radical oxidation, the interface flatness is not degraded regardless of the film thickness. The gate insulating film may be formed by radical nitridation or may be formed by a combination of radical oxidation and radical nitridation.

Thereafter, the MOSFET is formed by a known MOSFET forming method.

Specifically, the MOSFET shown in FIG. 9 is formed by forming a source diffusion layer 906 and a drain diffusion layer 907, by forming an interlayer insulating film 908, opening contact holes, and by forming a gate extraction electrode 909, a source extraction electrode 910, and a drain extraction electrode 911.

The MOSFET forming method is not particularly limited. As a method of forming the gate insulating film, use may be made of, for example, a method of isotropically oxidizing or nitriding the semiconductor substrate. As a method for element isolation between the transistors formed in large number, use may be made of STI (Shallow trench Isolation), LOCOS (Local Oxidation of Silicon), or the like. As an active region surface cleaning method and an oxide or nitride film forming method, use may be made of any method as long as the film thickness is on the same level.

As described above, according to this embodiment, the silicon wafer is specified by a surface which has the plurality of terraces formed stepwise by the single-atomic-layer steps, respectively, and which has no slip line.

Consequently, using this silicon wafer makes it possible to manufacture MOSFETs and circuits formed by those MOSFETs with a good yield, even if the diameter of the wafer is large (200 mm$\phi$ or more).

EXAMPLES

Hereinbelow, this invention will be described in further detail with reference to Examples.

<Slip-Line Evaluation>

Samples were prepared by heating silicon wafers each having a surface of (100) orientation at various heat treatment temperatures and the presence or absence of slip line was evaluated. Specific sequences are as follows.

(1) Sample Preparation

Example 1

First, a silicon wafer which had a diameter of 200 mm$\phi$ and which had a surface of (100) orientation was prepared and the silicon wafer surface was cleaned in the following sequence.

First, the silicon wafer surface was cleaned with $O_3$ water for 10 minutes, cleaned with dilute HF (0.5 wt %) for 1 minute, and finally rinsed with ultrapure water for 3 minutes.

Then, the silicon wafer was placed in a heat treatment apparatus shown in FIG. 3. While Ar which included 0.2 ppb or less of moisture and 0.1 ppb or less of $O_2$ was caused to flow at a flow rate of 20 L/min, a heat treatment was carried out under conditions of a heat treatment temperature of 850° C. and a heat treatment time of 180 minutes.

It is to be noted that the heat treatment was not carried out in the manner described above with reference to FIGS. 4, 5, and 6, but was carried out under heat treatment apparatus conditions equivalent to those of a heat treatment apparatus shown in FIG. 9 of the above-mentioned Patent Document 1.

Figure 10:
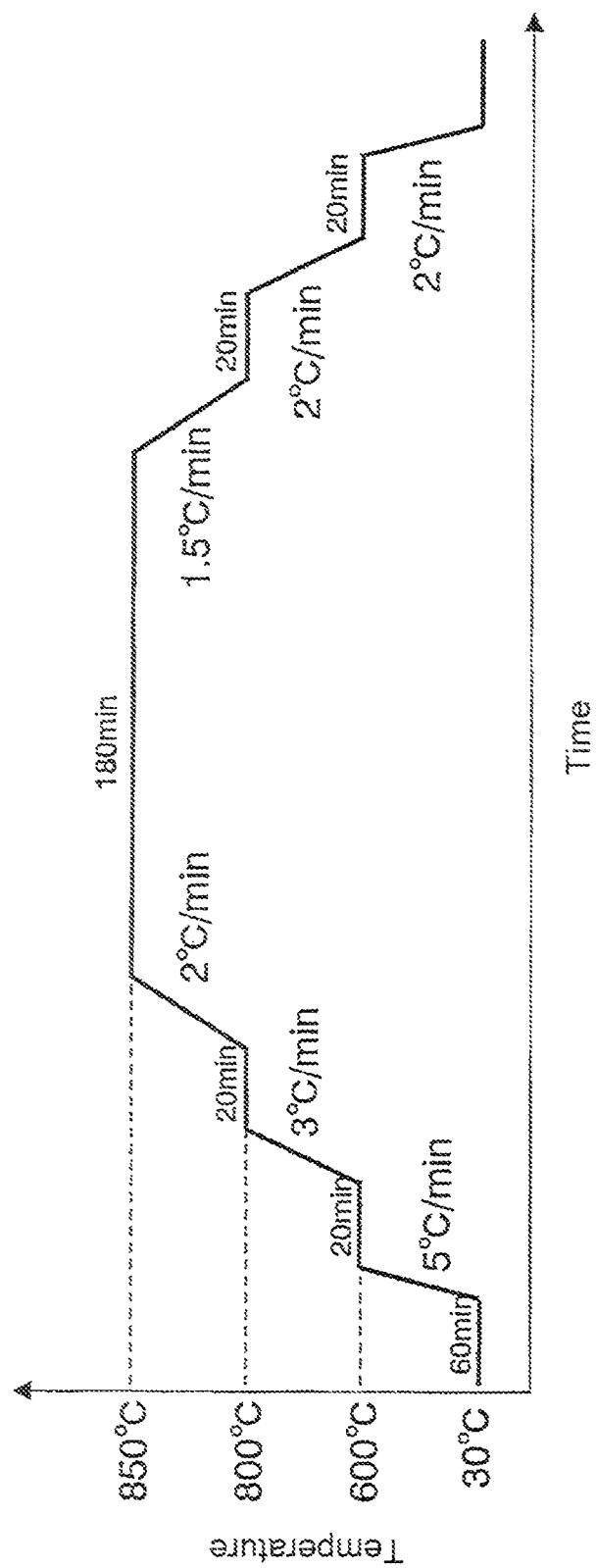
FIG. 10 is a graph showing a temperature profile during a heat treatment in Example 1.

Specifically, first, the silicon wafer was heated from 30° C. to 850° C. in a temperature sequence shown in FIG. 10 and was held at 850° C. for 180 minutes. Thereafter, the temperature of the silicon wafer was lowered to 30° C. in a temperature sequence shown in FIG. 10. A sample was prepared in the sequence described above.

Example 2

A sample was prepared under the same conditions as in Example 1 except that the Ar flow rate was set to 10 L/min and the heat treatment time (holding time) to 540 minutes.

Example 3

A sample was prepared under the same conditions as in Example 1 except that the Ar flow rate was set to 10 L/min and the heat treatment time (holding time) to 270 minutes.

Example 4-1

A sample was prepared under the same conditions as in Example 1 except that the Ar flow rate was set to 10 L/min, the heat treatment temperature to 900° C., and the heat treatment time (holding time) to 60 minutes.

Example 4-2

A sample was prepared under the same conditions as in Example 1 except that the Ar flow rate was set to 14 L/min, the heat treatment temperature to 800° C., and the heat treatment time (holding time) to 90 minutes.

Comparative Example 1

A sample was prepared under the same conditions as in Example 1 except that the Ar flow rate was set to 10 L/min, the heat treatment temperature (holding temperature) to 1100° C., and the heat treatment time (holding time) to 60 minutes.

Comparative Example 2

A sample was prepared under the same conditions as in Example 1 except that the Ar flow rate was set to 10 L/min, the heat treatment temperature (holding temperature) to 1200° C., and the heat treatment time (holding time) to 60 minutes.

(2) Sample Evaluation

By using X-ray topography (X-ray diffraction topography), the presence or absence of slip line of each prepared sample was evaluated. RU-300 manufactured by Rigaku Denki K.K. was used in the evaluation and the presence or absence of slip line was evaluated by a transmission X-ray topograph.

Further, a surface of each sample was observed using an AFM (SPI400 manufactured by Seiko Instruments Inc.). The off angle and direction of each sample were measured using an X-ray diffraction apparatus (X' pert Pro manufactured by PANalytical, Inc.).

Evaluation results are shown in Table 1 and transmission X-ray topographs of Examples 1, 2, and 4 (4-1, 4-2) and Comparative Example 1 are shown in FIG. 1.

Figure 7:
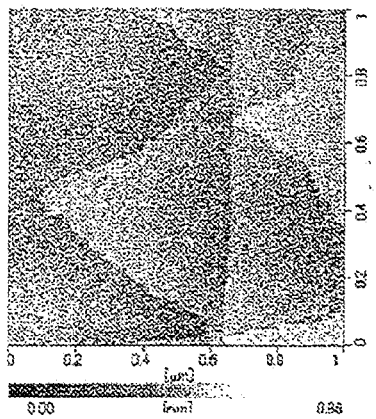
FIG. 7 is a photographic diagram showing AFM images of sample surfaces in Examples 1 and 4-1 and Comparative Examples 1 and 2.
Figure 7:
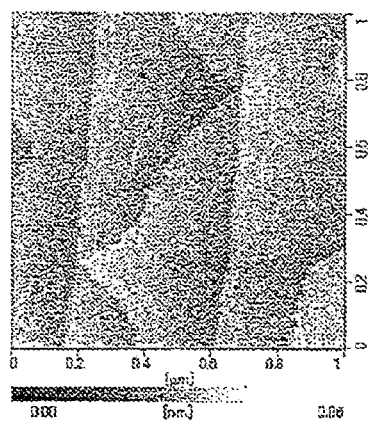
Figure 7:
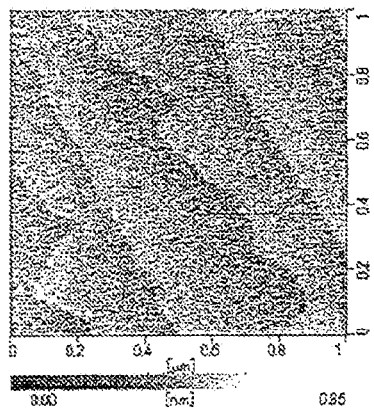
Figure 7:
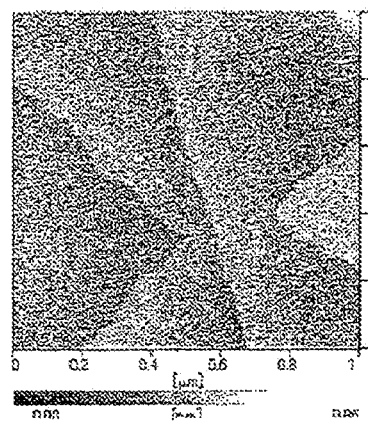

AFM images of Examples 1 and 4-1 and Comparative Examples 1 and 2 are shown in FIG. 7.

Figure 13:
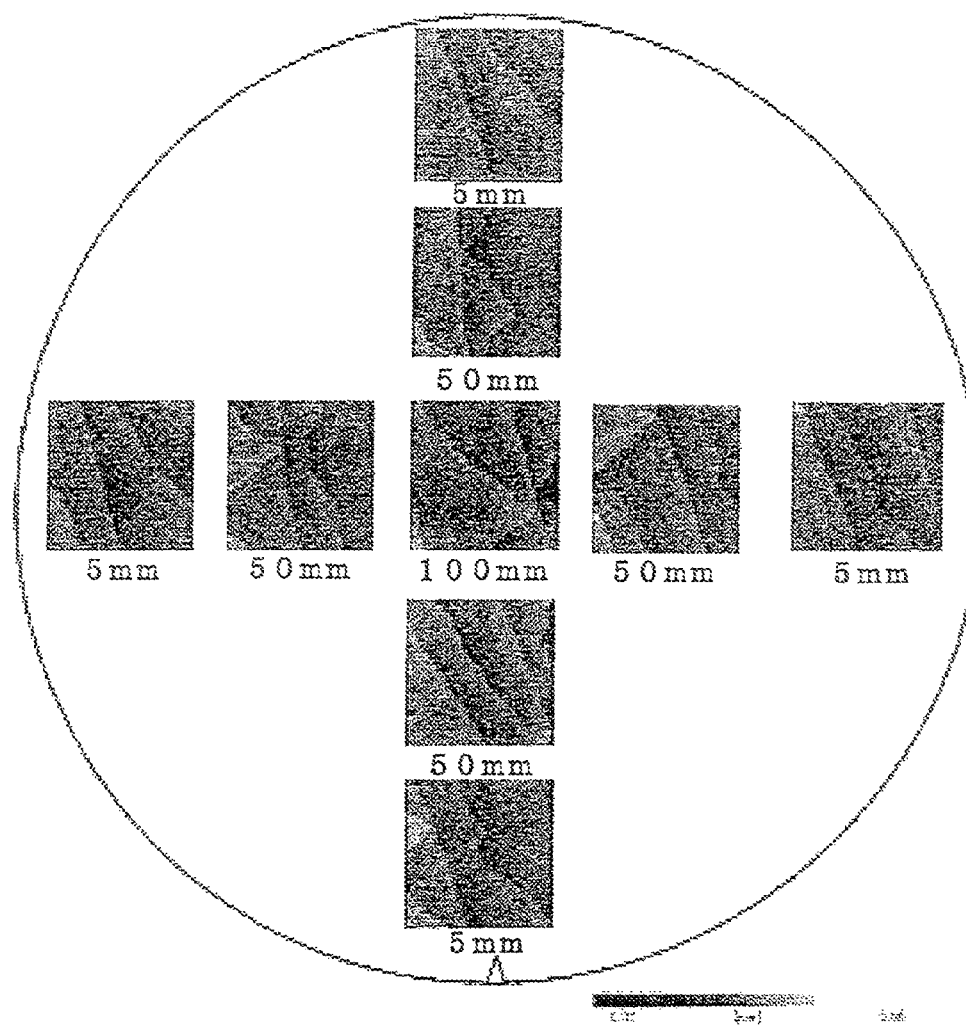
FIG. 13 is a photographic diagram showing AFM images of a sample surface in Example 4-1.

Further, AFM images of Example 4-2 are shown in FIG. 13. The AFM images at upper, lower, left, and right ends were respectively measured at places 5 mm away from the edge of the wafer. The center AFM image was measured at the central portion (100 mm from the wafer edge). The AFM images between the central portion and the upper, lower, left, and right ends, respectively, were measured at places 50 mm away from the edge of the wafer.

TABLE 1

| No. | Heat Treatment Temperature | Ar Flow Rate | Heat Treatment Time | Slip Line |
|---|---|---|---|---|
| Example 1 | 850° C. | 20 L/min | 180 min | none |
| Example 2 | 850° C. | 10 L/min | 540 min | none |
| Example 3 | 850° C. | 10 L/min | 270 min | none |
| Example 4-1 | 900° C. | 10 L/min | 60 min | none |
| Example 4-2 | 800° C. | 14 L/min | 90 min | none |
| Comparative Example 1 | 1100° C. | 10 L/min | 60 min | yes |
| Comparative Example 2 | 1200° C. | 10 L/min | 60 min | yes |

As is clear from Table 1 and FIGS. 1 and 10, no slip line appeared in any of the samples heat-treated at 900° C. or less (Examples 1 to 4 (4-1, 4-2)) and thus it is seen that no crystal defect occurred due to the heat treatment. No other surface or point defect was observed either.

On the other hand, in Comparative Examples 1 and 2, slip lines were observed (see FIG. 1 (*a*)) and thus it is seen that the crystal defects occurred due to the heat treatment.

Further, as is clear from FIGS. 7 and 13, all the samples were each observed to have a surface formed with a plurality of terraces which were formed stepwise by atomic-order steps, respectively, and thus it is seen that the atomically flat surfaces were obtained in all the samples.

<Evaluation of Surface Asperity with Radical Oxidation>

Various treatments were applied to the surfaces of the obtained samples, thereby evaluating the shapes of the flat surfaces. Specific sequences are as follows.

(1) Sample Preparation

Example 5

By using a microwave-excited plasma apparatus manufactured by Tokyo Electron Ltd., the sample of Example 1 was radically oxidized under conditions of a temperature of 400° C., 133 Pa, and a Kr/O₂ flow rate ratio of 98/2, thereby forming an oxide layer of 6 nm. Thereafter, the oxide film was removed using a solution in which 36 wt % HCl and 50 wt % HF were mixed at 19/1. The removal of the oxide film was judged by confirming the hydrophobicity.

Comparative Example 3

By using α-8 manufactured by Tokyo Electron Ltd., the sample of Example 1 was heated in an O₂ atmosphere at a temperature of 900° C. for 10 minutes to thermally oxidize the surface of the sample, thereby forming an oxide layer of 6 nm. Thereafter, the oxide film was removed using a solution in which 36 wt % HCl and 50 wt % HF were mixed at 19/1. The removal of the oxide film was judged by confirming the hydrophobicity.

Comparative Example 4

By using α-8 manufactured by Tokyo Electron Ltd., the sample of Example 1 was heated in an O₂ atmosphere at a temperature of 1000° C. for 10 minutes to thermally oxidize the surface of the sample, thereby forming an oxide layer of 17 nm. Thereafter, the oxide film was removed using a solution in which 36 wt % HCl and 50 wt % HF were mixed at 19/1. The removal of the oxide film was judged by confirming the hydrophobicity.

Comparative Example 5

The sample of Example 1 was cleaned for 1 minute using a solution in which 36 wt % HCl and 50 wt % HF were mixed at 19/1, and then was rinsed with ultrapure water for 5 minutes (that is, the surface was not oxidized).

(2) Sample Evaluation

Then, the surface shapes of Example 5 and Comparative Examples 3 to 5 before and after the oxidation (before and after the cleaning in Comparative Example 5) were observed by using an AFM. The results are shown in FIG. 11. AFM images of FIG. 11 are each 1 μm square.

As shown in FIG. 11, it is seen that steps and terraces clearly appeared on the surface even after the oxidation in the radically oxidized sample (Example 5) and thus that the surface flatness on the atomic order was maintained.

On the other hand, it is seen that steps and terraces became unclear in the thermally oxidized samples (Comparative Examples 3 and 4) and thus that the surface flatness on the atomic order was degraded.

<Evaluation of MOSFET Current-Voltage Characteristics>

MOSFETs like the one shown in FIGS. 8 and 9 were formed in the following sequence and the drain current-drain voltage ($I_D$-$V_D$) characteristics were evaluated.

(1) Sample Preparation

Example 6

First, the surface of the sample of Example 1 was cleaned by a cleaning method using no alkaline solution, which is described in T. Ohmi, "Total room temperature wet cleaning Si substrate surface," J. Electrochem. Soc., Vol. 143, No. 9, pp. 2957-2964, September 1996. Then, a SiO₂ film 902 of 7 nm was formed under a condition of a temperature of 400° C. by radical oxidation which directly oxidizes the substrate surface by oxygen radicals generated by plasma, and then a SiO₂ film 903 of 300 nm was formed by CVD.

Then, an active region where a MOS transistor was to be formed was opened by photolithography.

By using a photoresist as a mask material, the SiO₂ film 902 and the SiO₂ film 903 at an opening portion were removed by a solution of HCl/HF=19/1. Then, the photoresist was removed by a solution of H₂SO₄/H₂O₂=4:1. Thereafter, the exposed semiconductor surface was cleaned by the above-mentioned cleaning method using no alkaline solution. Then, a SiO₂ film 904 was formed to 5.6 nm as a gate insulating film by radical oxidation and polycrystalline polysilicon was formed as a gate electrode 905. Thereafter, formation of a source diffusion layer 906 and a drain diffusion layer 907, formation of an interlayer insulating film 908, opening of contact holes, and formation of a gate extraction electrode 909, a source extraction electrode 910, and a drain extraction electrode 911 were carried out by a known technique, thereby completing the MOSFET shown in FIG. 9.

Comparative Example 6

A MOSFET was formed under the same conditions as in Example 5 except that Ra=0.06 nm without carrying out the flattening treatment.

(2) Sample Evaluation

Drain currents were measured by applying to the prepared samples drain voltages by steps of 0.5V in the range of −3V to 3V. The results are shown in FIG. 12.

Figure 12:
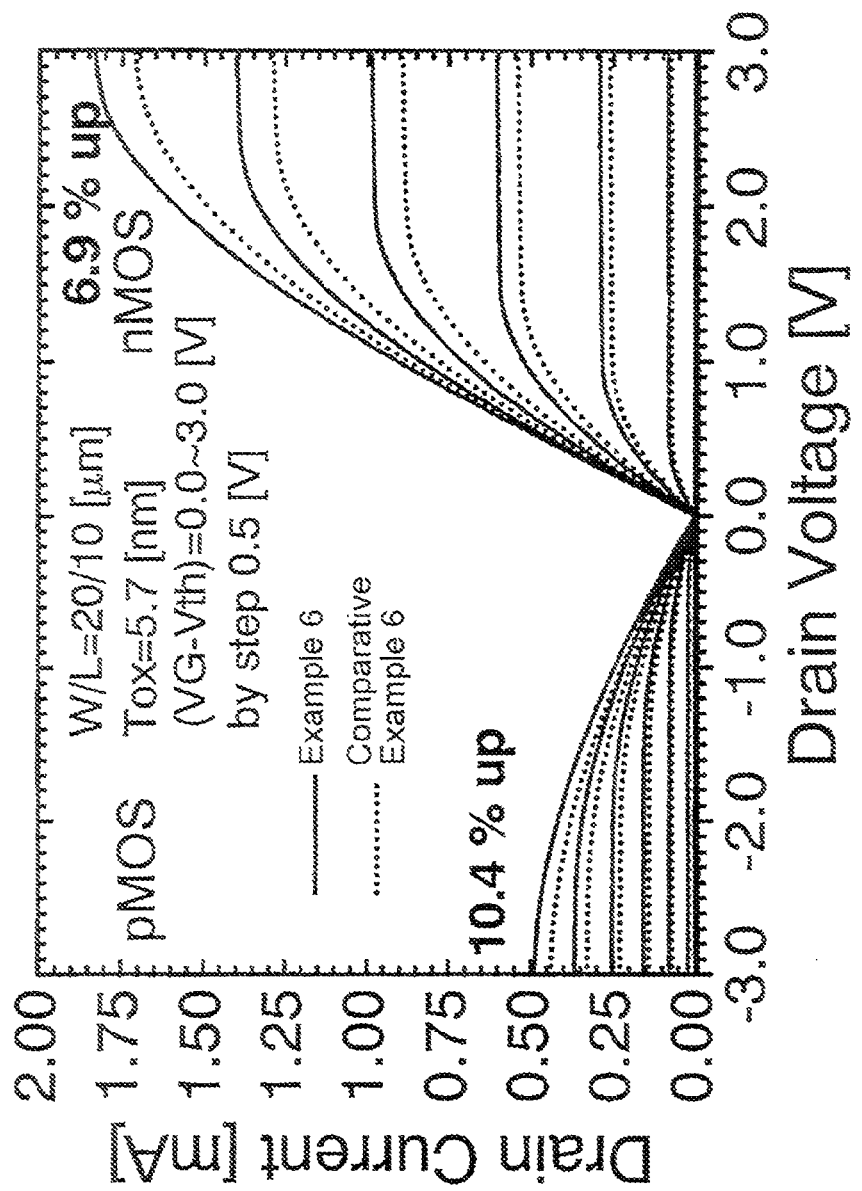
FIG. 12 is a diagram showing drain voltage-drain current characteristics in Example 6 and Comparative Example 6.

As is clear from FIG. 12, a drain current in the MOSFET of Example 6 having the flat interface was greater than that in the MOSFET of Comparative Example 6 when the same gate and drain voltages were applied, and thus it is seen that the excellent MOSFET was formed.

<Cumulative Failure Rate (Cumulative Failure [%]) Evaluation>

Figure 14:
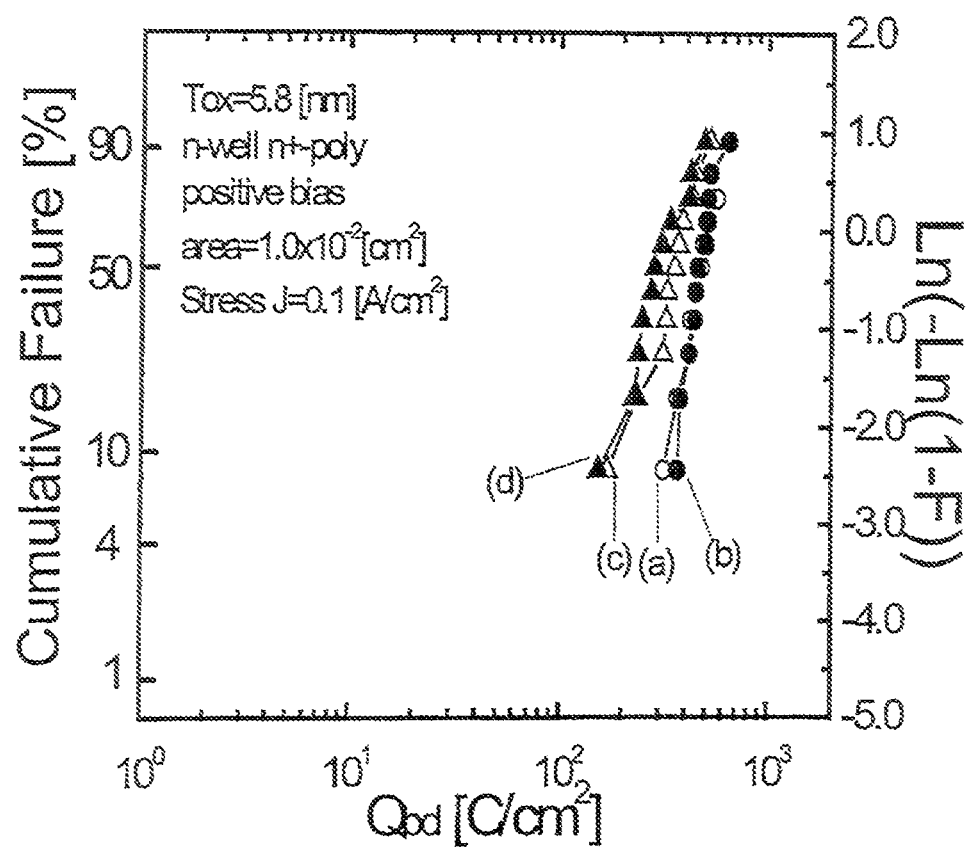
FIG. 14 is a diagram showing cumulative failure rate (Cumulative Failure [%]) evaluation results (evaluation area: 1 mm×1 mm).

FIG. 14 is a diagram showing the results of conducting cumulative failure rate evaluation by setting the evaluation area to 1 mm×1 mm. The abscissa axis represents the quantity of charge (charges to breakdown) Qbd that flows until breakdown, while the ordinate axis represents the cumulative failure rate. The performance increases as moving rightward in the graph.

In FIG. 14, (a) represents a case where a surface was atomically flattened by setting the heat treatment temperature to 1100° C., (b) represents a case where a surface was atomically flattened by setting the heat treatment temperature to 800° C., (c) represents a case where no atomically flattening treatment was carried out, and (d) represents a case where the surface roughness was increased by APM after carrying out a flattening treatment. FIG. 11 shows the results of measurement which was carried out by forming an oxide film of 5.8 nm on respective samples by radical oxidation to produce MOS diodes.

From the results shown in FIG. 14, it is seen that Qbd was larger in the flattened samples, i.e. (a) and (b), than in the samples with a greater roughness, i.e. (c) and (d).

Figure 15:
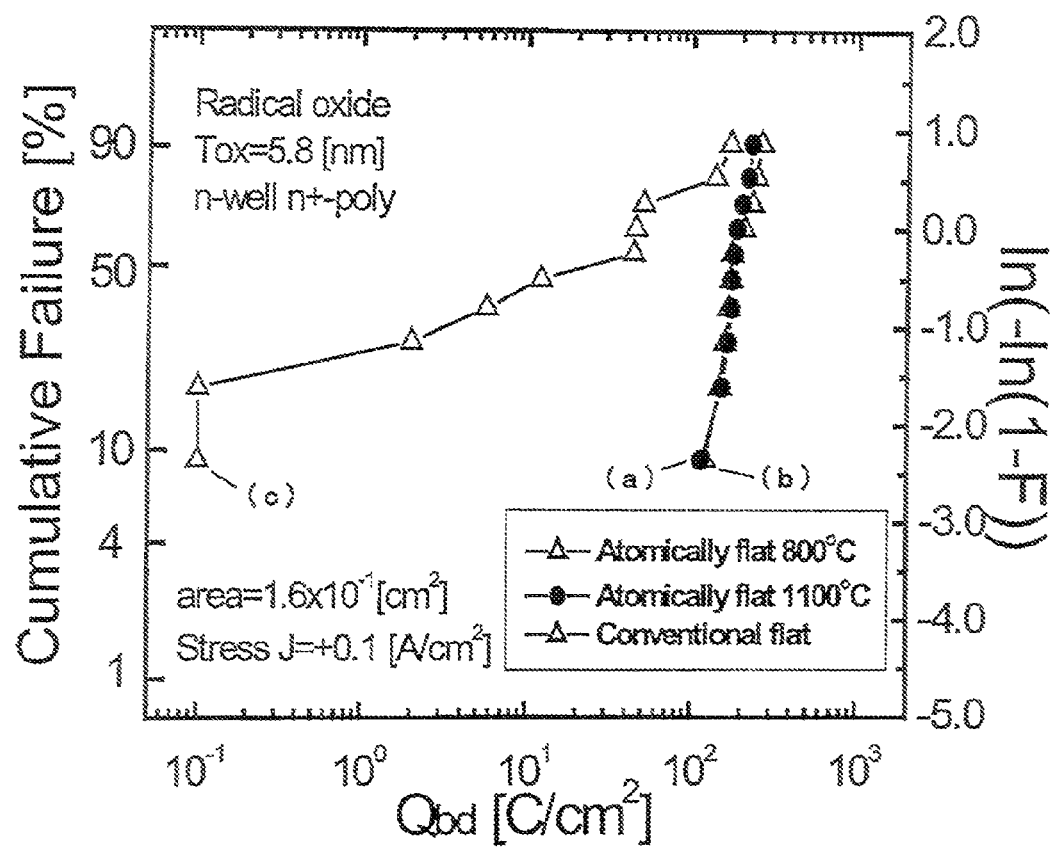
FIG. 15 is a diagram showing cumulative failure rate (Cumulative Failure [%]) evaluation results (evaluation area: 4 mm×4 mm).

FIG. 15 is a diagram which likewise shows the results of conducting cumulative failure rate evaluation by setting the evaluation area to 4 mm×4 mm.

In FIG. 15, (a) represents a case where a surface was atomically flattened by setting the heat treatment temperature to 1100° C., (b) represents a case where a surface was atomically flattened by setting the heat treatment temperature to 800° C., and (c) represents a case where no atomically flattening treatment was carried out. FIG. 15 shows the results of measurement which was carried out by forming an oxide film of 5.8 nm on respective samples by radical oxidation to produce MOS diodes.

From the results shown in FIG. 15, it is seen that when the evaluation was performed with the large-area sample, initial failure can be removed by carrying out the flattening treatment.

Example 7

Samples were prepared by heat-treating silicon wafers each having a surface of (100) orientation at various heat treatment temperatures and at various flow rates of Ar as a heat treatment atmospheric gas, thereby examining the degree of the influence of the heat treatment temperature and the Ar flow rate on a flattening treatment. The presence or absence of slip line was evaluated in the same manner as in Example 1. Specific sequences are as follows.

(1) Sample Preparation

First, a silicon wafer with a diameter of 300 mmφ having a surface of (100) orientation was prepared and the silicon wafer surface was cleaned in the following sequence.

First, the silicon wafer surface was cleaned with $O_3$ (ozone) water for 10 minutes, cleaned with dilute HF (0.5 wt %) for 1 minute, and finally rinsed with ultrapure water for 3 minutes.

Then, the silicon wafer was placed in the heat treatment apparatus shown in FIG. 3. While flowing Ar with a purity of 0.02 ppb or less moisture and 0.01 ppb or less $O_2$, a heat treatment was carried out at a predetermined heat treatment temperature for 180 minutes.

The heat treatment was carried out while completely preventing entering of the atmosphere and a floating metal into the apparatus as in the manner described above with reference to FIGS. 4, 5, and 6. Ar was used as a gas for preventing entering of the atmosphere and was caused to constantly flow at a pressure slightly higher than that in the inner tube 305.

Specifically, first, the silicon wafer was heated from 30° C. to a heat treatment maintaining temperature (850° C. in FIG. 10) in a temperature sequence equivalent to a temperature sequence pattern shown in FIG. 10 and was held at that temperature for 180 minutes. Thereafter, the temperature of the silicon wafer was lowered to 30° C. in a temperature sequence equivalent to a temperature sequence pattern shown in FIG. 10. Each of samples was prepared in the sequence described above.

Figure 16:
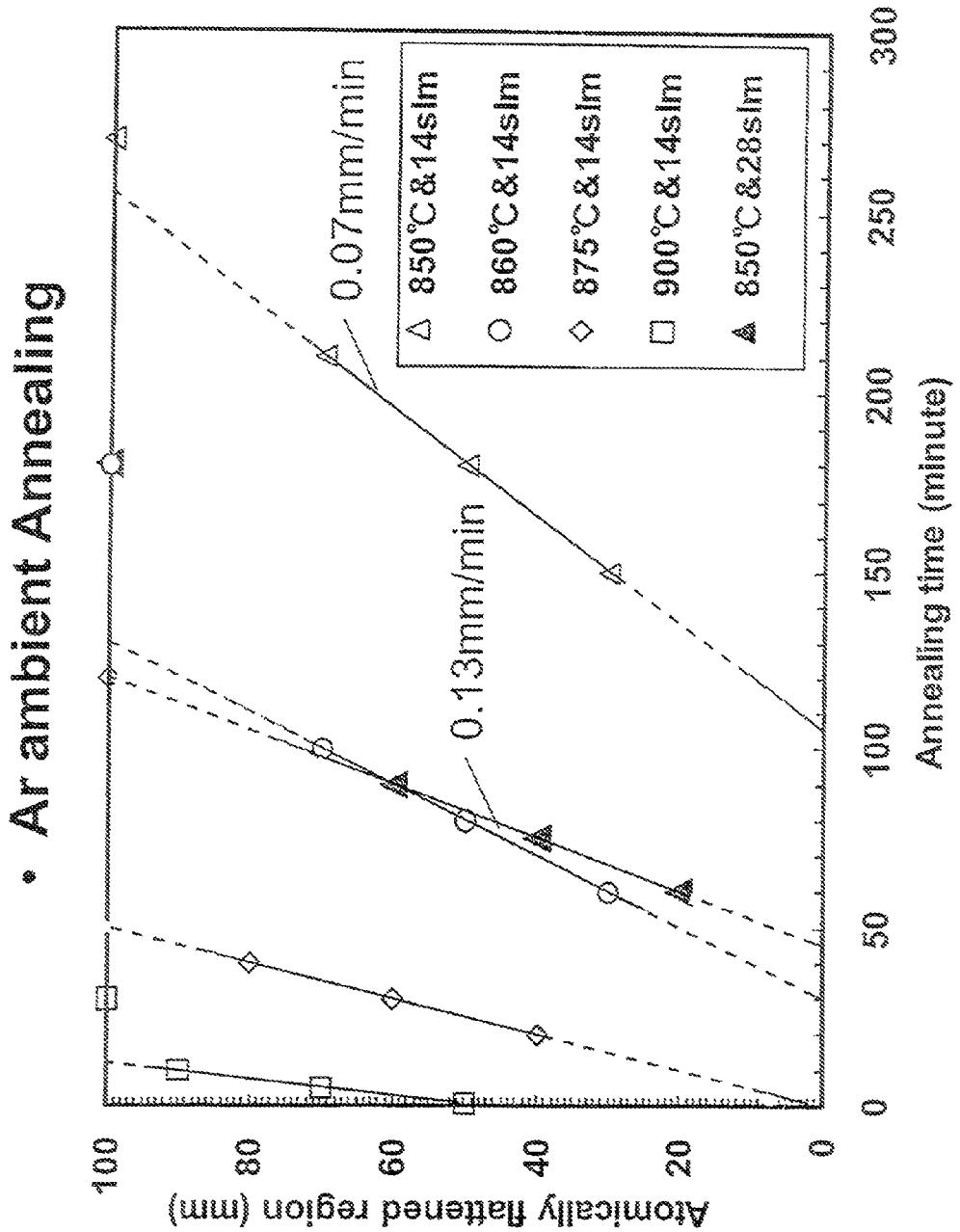
FIG. 16 is a diagram showing test results of evaluating the degree of the influence of a heat treatment temperature and an Ar flow rate on a flattening treatment.

The results are shown in FIG. 16. No slip line was observed in any of the samples. Consequently, it was confirmed that surfaces were extremely excellent in flatness.

| | Heat Treatment Temperature (° C.) | Ar Flow Rate (slm) |
|---|---|---|
| Sample 1 (Δ) | 850 | 14 |
| Sample 2 (○) | 860 | 14 |
| Sample 3 (◇) | 875 | 14 |
| Sample 4 (□) | 900 | 14 |
| Sample 5 (black triangle) | 850 | 28 |

As is clear from FIG. 16, when the Ar flow rate is the same, the higher the heat treatment temperature, the faster the flattening treatment speed becomes, while when the heat treatment temperature is the same, the greater the Ar flow rate, the faster the flattening treatment speed becomes.

INDUSTRIAL APPLICABILITY

In the above-mentioned embodiment, the description has been given only of the case where this invention is applied to MOSFETs. However, this invention is by no means limited thereto and is applicable to any structure using a silicon wafer having a flat surface.

The invention claimed is:

1. A heat treatment apparatus comprising an outer tube defining therein a heat treatment space and having a double wall structure, a heater provided on the outside of the outer tube, an inner tube provided in the heat treatment space for introducing and discharging an inert gas, and a wafer setting stage disposed in the inner tube, wherein
   the outer tube has an inner wall and an outer wall to define a hollow portion between the inner and the outer walls and to discharge a metal separated from the heater, and
   the inner tube has portions that introduce and discharge the inert gas respectively, and that have introducing and discharging flanges for the inert gas and pipes that introduce an inert gas to the inside of the introducing and discharging flanges, respectively.

2. The heat treatment apparatus according to claim 1, wherein an inert gas is caused to flow in the gas flow passage of the outer tube.

3. The heat treatment apparatus according to claim 1, wherein the inner tube is attached through an O-ring and an inert gas is supplied to the O-ring from the outside of the heat treatment space.

4. A silicon wafer which is subjected to a heat treatment by the use of the heat treatment apparatus according to claim 1, the silicon wafer having a surface with a plurality of terraces formed stepwise by single-atomic-layer steps, respectively, and which has no slip line, wherein the surface has a plane orientation of (100) crystal plane and is flattened at a temperature of 900° C. or less.

5. The silicon wafer according to claim 4, having a diameter of 200 mmϕ or more in size.

* * * * *